United States Patent
Fu et al.

(10) Patent No.: US 6,692,617 B1
(45) Date of Patent: Feb. 17, 2004

(54) SUSTAINED SELF-SPUTTERING REACTOR HAVING AN INCREASED DENSITY PLASMA

(75) Inventors: Jianming Fu, San Jose, CA (US); Peijun Ding, San Jose, CA (US); Zheng Xu, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1088 days.

(21) Appl. No.: 08/854,008

(22) Filed: May 8, 1997

(51) Int. Cl.⁷ ............................................... C25C 14/34
(52) U.S. Cl. ........................... 204/192.12; 204/192.15; 204/298.06; 204/298.08; 204/298.11; 204/298.14; 204/298.19; 204/298.2
(58) Field of Search ................ 204/298.06, 298.08, 204/298.11, 298.14, 298.16, 298.17, 298.19, 298.2, 192.12, 192.15

(56) References Cited

U.S. PATENT DOCUMENTS

| | | | | |
|---|---|---|---|---|
| 4,824,544 A | * | 4/1989 | Mikalesen et al. | 204/298.06 |
| 5,242,566 A | | 9/1993 | Parker | 204/298.2 |
| 5,320,728 A | | 6/1994 | Tepman | 204/192.12 |
| 5,330,628 A | * | 7/1994 | Banerjee | 204/192.12 |

FOREIGN PATENT DOCUMENTS

| | | | | |
|---|---|---|---|---|
| EP | 703 598 A1 | | 3/1996 | |
| JP | 61-174725 | * | 8/1986 | 204/298.06 |
| JP | 64-28921 | * | 1/1989 | 204/298.2 |
| JP | 2-298263 | * | 12/1990 | 204/298.2 |
| JP | 3-240944 | * | 10/1991 | |
| JP | 3-140487 | * | 6/1992 | 204/298.2 |
| JP | 5-195213 | * | 8/1993 | 204/298.06 |
| JP | 5-311419 | * | 11/1993 | 204/298.11 |
| JP | 7-126844 | * | 5/1995 | |

OTHER PUBLICATIONS

Asamaki et al., "Copper self-sputtering by planar magnetron," *Japanese Journal of Applied Physics*, vol. 33, pt. 1, No. 8, pp. 2500–2503, 1994.*

Posadowski et al., "Sustained self-sputtering using a direct current magnetron source," *Journal of Vacuum Science and Technology*, vol. 11, No. 6, pp. 2980–2984, 1993.*

Murarka et al., "Copper metallization for ULSI and beyond," *Critical Reviews in Solid State and Materials Science*, vol. 10, No. 2, 1995, pp. 87–124.

Posadowski et al., "Sustained self-sputtering using a direct current magnetron source," *Journal of Vacuum Science and Technology*, vol. 11, No. 6, 1993, pp. 2980–2984.

Asamaki et al., "Filing of sub-$\mu$m holes by self-sputter deposition," *Japanese Journal of Applied Physics*, vol. 33, pt. 1, No. 8, 1999, pp. 4566–4569.

* cited by examiner

Primary Examiner—Rodney G. McDonald
(74) Attorney, Agent, or Firm—Charles S. Guenzer, Esq.

(57) ABSTRACT

A plasma reactor for physical vapor deposition (PVD), also known as sputtering, which is adapted so that the atomic species sputtered from the target can self-sustain the plasma without the need of a working gas such as argon. The self-sustained sputtering (SSS), which is particularly applicable to copper sputtering, is enabled by several means. The density of the plasma in the region of the magnet assembly of the magnetron is intensified for a fixed target power by reducing the size of the magnets. To provide more uniform sputtering, the small magnetron is scanned in one or two dimensions over the back of the target. The density of the plasma next to the target is also intensified by positioning an anode grid between the target and the substrate, which provides a more planar geometry. Additionally, the substrate can then be biased to more effectively control the energy and directionality of the flux of sputtered particles incident on the wafer.

25 Claims, 5 Drawing Sheets

(PRIOR ART)

SUSTAINED SELF-SPUTTERING REACTOR HAVING AN INCREASED DENSITY PLASMA

FIELD OF THE INVENTION

The invention relates generally to plasma processing of workpieces such as semiconductor integrated circuits. In particular, the invention relates to the physical vapor deposition (PVD) with sustained self-sputtering.

BACKGROUND ART

A critical part of any advanced semiconductor integrated circuit involves the one or more metallization levels used to contact and interconnect the active semiconductor areas, themselves usually residing in a fairly well defined crystalline silicon substrate. Although it is possible to interconnect a few transistors or other semiconductor devices, such as memory capacitors, within the semiconductor level, the increasingly complex-topology of multiply connected devices soon necessitates another level of interconnect. Typically, an active silicon layer with transistors and capacitors formed therein is overlaid with a dielectric layer, for example, silicon dioxide. Contact holes are etched through the dielectric layer to particular contacting areas of the silicon devices. A metal is filled into the contact holes and is also deposited on top of the dielectric layer to form horizontal interconnects between the silicon contacts and other electrical points. Such a process is referred to as metallization.

A single level of metallization may suffice for simple integrated circuits of small capacity. However, dense memory chips and especially complex logic devices require additional levels of metallization since a single level does not provide the required level of interconnection between active areas. Additional metallization levels are achieved by depositing over the previous metallized horizontal interconnects another level of dielectric and repeating the process of etching holes, now called vias, through the dielectric, filling the vias and overlaying the added dielectric layer with a metal, and defining the metal above the added dielectric as an additional wiring layer. Very advanced logic device, for example, fifth-generation microprocessors, have five or more levels of metallization.

Conventionally, the metallized layers have been composed of aluminum and aluminum-based alloys additionally comprising at most a few percent of alloying elements such as copper and silicon. The metallization deposition has typically been accomplished by physical vapor deposition (PVD), also known as sputtering. A conventional PVD reactor 10 is illustrated schematically in cross section in FIG. 1, and the illustration is based upon the Endura PVD Reactor available from Applied Materials, Inc. of Santa Clara, Calif. The reactor 10 includes a vacuum chamber 12 sealed to a PVD target 14 composed of the material to be sputter deposited on a wafer 16 held on a heater pedestal 18. A shield 20 held within the chamber protects the chamber wall 12 from the sputtered material and provides the anode grounding plane. A selectable DC power supply 22 biases the target negatively to about −600 VDC with respect to the shield 20. Conventionally, the pedestal 18 and hence the wafer 16 is left electrically floating.

Figure 1:
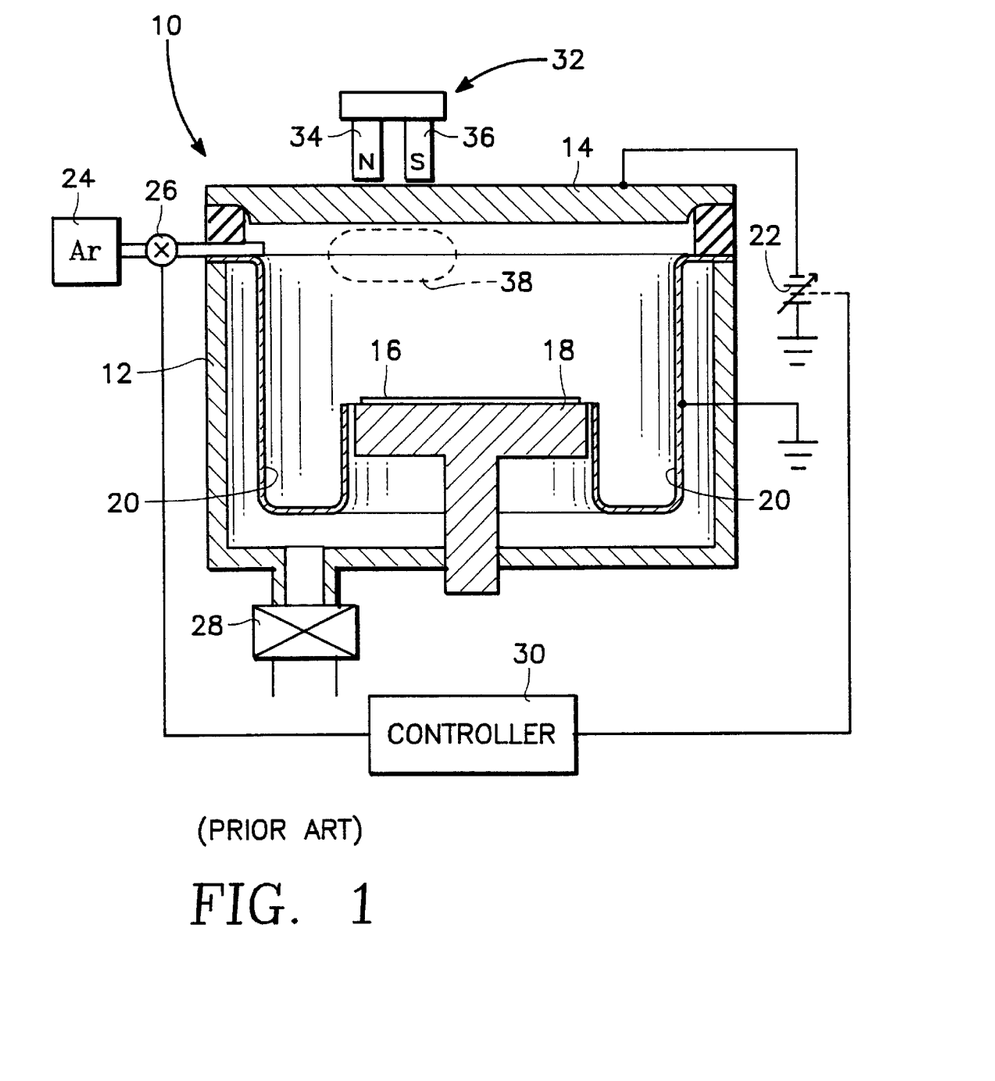
FIG. 1 is a schematic cross-sectional view of a conventional PVD reactor.

A gas source 24 of sputtering working gas, typically chemically inactive argon, supplies the working gas to the chamber through a mass flow controller 26. A vacuum system 28 maintains the chamber at a low pressure. Although the base pressure can be held to about $10^{-7}$ Torr or even lower, the pressure of the working gas is kept between about 1 and 1000 mTorr. A computer-based controller 30 controls the reactor including the DC power supply 22 and the mass flow controller 26.

When the argon is admitted into the chamber, the DC voltage between the target 14 and the shield 20 ignites the argon into a plasma, and the positively charged argon ions are attracted to the negatively charged target 14. The ions strike the target 14 at a substantial energy and cause target atoms or atomic clusters to be sputtered from the target 14. Some of the target particles strike the wafer 16 and are thereby deposited on it, thereby forming a film of the target material.

To provide efficient sputtering, a magnetron 32 is positioned in back of the target 14. It has opposed magnets 34, 36 creating a magnetic field within the chamber in the neighborhood of the magnets 34, 36. The magnetic field traps electrons, and for charge neutrality, the ion density also increases to form a high-density plasma region 38 within the chamber adjacent to the magnetron 32.

With the continuing miniaturization of integrated circuits, the demands upon the metallization have increased. Many now believe that aluminum metallization should be replaced by copper metallization. Murarka et al. provide a comprehensive review article on copper metallization in "Copper metallization for ULSI and beyond," *Critical Reviews in Solid State and Materials Science*, vol. 10, no. 2, 1995, pp. 87–124. Copper offers a number of advantages. Its bulk resistivity is less than that of aluminum, 1.67 $\mu\Omega$-cm vs. 2.7 $\mu\Omega$-cm for pure material, and any reduction in resistivity offers significant advantages as the widths and thicknesses of the metallization interconnects continue to decreased. Furthermore, a continuing problem with aluminum metallization is the tendency of aluminum atoms in an aluminum interconnect carrying a high current density to migrate along the interconnect, especially away from hot spots, in a process called electromigration. Any excessive amount of such migration will break an aluminum interconnect and destroy the integrated circuit. Copper-based alloys exhibit significantly reduced levels of electromigration.

Copper metallization is an unproven technology and is acknowledged to offer difficulties not experienced with the conventional aluminum metallization. However, it may afford ways to circumvent problems inherent in aluminum metallization.

One problem inherent in conventional sputtering is that it is performed in a fairly high pressure of the inert working gas, such as argon. However, the argon environment presents two problems. First, it is inevitable that some argon ions are deposited on the substrate and incorporated into the sputter deposited aluminum. Although the effect of these usually inactive argon ions is not precisely known, it is probably not positive.

The second problem relates to the directionality of the sputtered particles. Sputtering to fill holes relies at least in part on the sputtered particles being ballistically transported from the target to the wafer, that is, without scattering from the initial course. The ballistic trajectories allow the sputtered particles to arrive at the wafer nearly perpendicularly to the wafer's surface and thus to deeply penetrate into any aperture. However, the typical sputtering is performed in an argon ambient of from 1 to 100 mTorr. Such a high pressure means that there is a significant probability that the aluminum sputter particles will collide with the argon atoms and thus be deflected from their ballistic paths. Accordingly, low-pressure sputtering is believed to provide better hole filling for deep vias. However, low pressure is generally equated with low deposition rates so that reducing the pressure is not a favored method for better directionality. Furthermore, a minimum pressure approaching 1 mTorr is required to support a plasma in the usual configuration of FIG. 1.

High-density plasma (HDP) sputter reactors are being actively developed and are approaching commercialization. One of the advantages of HDP sputtering is that a sizable fraction of the sputtered particles are ionized during their travel toward the substrate. Then, the pedestal supporting the wafer can be selectively biased by an RF source to create a DC self-bias with respect to the positively charged plasma. As a result, the wafer can be biased negatively with respect to the plasma (−20V being a typical value), and the positively charged sputtered ions are accelerated from the generally neutral plasma toward the substrate. The added velocity provides a highly directional flux normal to the plane of the substrate, thus reaching deeply into holes of high aspect ratios. Nulman in European Patent Publication 703,598-A1 discloses inserting a negatively biased grid between the substrate and the HDP source using argon working gas.

There has been much recent interest in the PVD deposition of copper films using sustained self-sputtering (SSS), for example, as disclosed by Posadowski et al. in "Sustained self-sputtering using a direct current magnetron source," *Journal of Vacuum Science and Technology, A*, vol. 11, no. 6, 1993, pp. 2980–2984. No working gas is used in sustained self-sputtering, at least after the plasma has been ignited. Instead, a sufficient number of the atoms sputtered from the target are ionized and are then attracted back to the target at sufficiently high energy to serve as the sputtering ions in place of the more typical argon ions.

The condition for achieving self-sustained sputtering, which is observed only with some target materials under special conditions, may be expressed as $$\alpha \cdot \beta \cdot S_m = 1, \qquad (1)$$

where $\alpha$ is the ionization fraction of the atoms sputtered from the target, $\beta$ is the ratio of sputtered atoms that return to the target, and $S_m$ is the self-sputtering yield, that is, the number of copper atoms in the case of a copper target that are sputtered from the target by one returning copper atom. The ionization fraction and the return ratio depend upon the material and the current density, but they are necessarily less than unity. Generally the product $\alpha\beta$ increases at high current density. Hence, a large value of the self-sputtering yield is crucial for sustained self-sputtering, and a high current density is also important. The conventional metallization material Al and other metals used with Al hole filling, viz., Ti, Mo, W, and Ta, have sub-unity self-sputtering yields, thus precluding their use in sustained self-sputtering. However, Cu has an acceptable value of self-sputtering, as do Pd, Pt, Ag, and Au.

Asamaki et al. have reported the SSS deposition of copper in "Copper self-sputtering by planar magnetron," *Japanese Journal of Applied Physics*, vol. 33, pt. 1, no. 5A, 1994, pp. 2500–2503 and in "Filling of sub-µm through holes by self-sputter deposition," *Japanese Journal of Applied Physics*, vol. 33, pt. 1, no. 8, 1994, pp. 4566–4569. They reported in the last reference very good bottom coverage in 0.4 µm holes having aspect ratios of about 3.

However, the known SSS work has been of an experimental nature and several difficult problems need to be addressed before sustained self-sputtering can be commercialized for the mass integrated circuit market.

Most new semiconductor fabrication equipment is being developed for wafer sizes of 200 mm, and, in view the burgeoning developments for fabricating 300 mm wafers, new technology such as copper SSS needs to be shown to be usable at 200 mm and believed to be scalable to 300 mm. Even for 200 mm wafers, the typical target diameter for commercial PVD reactors is about 325 mm.

Achieving uniform PVD deposition over 200 mm at a reasonable deposition rate even for conventional PVD of aluminum has been challenging. Parker in U.S. Pat. No. 5,242,566 and Tepman in U.S. Pat. No. 5,320,728 disclose magnetrons having a generally linear array of magnets arranged along the outline of a kidney shape and the array being rotated at the back of the target about a point either within the kidney shape or a point having both halves of a diameter passing through the kidney shape. This magnet array has a size of about the size of the wafer for a 325 mm target over a 200 mm wafer. The large size of the magnet array is consistent with the trend to larger magnets. However, we have tested the conventional Tepman design for sustained self-sputtering of copper but could not achieve sustained self-sputtering.

A conventional Tepman magnetron produces a magnetic field within the chamber of about 200 gauss. This magnetic intensity is somewhat low for sustained self-sputtering which requires a high plasma density, which depends at least in part on a high magnetic intensity. However, the extended arrangement of Tepman presents some more fundamental problems.

First, the electrons in a high-density (HDP) plasma tend to quickly diffuse to the sides. In the kidney arrangement of Tepman, as with other linear magnetic arrays, the linearly concentrated magnetic field distribution is surrounded on two sides by low-field regions. That is, the HDP electrons tend to diffuse away from the HDP region and be lost, thereby reducing the plasma density from the high levels required for SSS.

Secondly, the region of relatively high magnetic field in the Tepman arrangement extends over a relatively large fraction of the target. Although this large coverage may promote uniformity, it means that for a given amount of electrical power applied to the target the large area reduces the power density into the high-density plasma. For large commercial PVD reactors, the amount of target power required with the Tepman magnetron to sustain self-sputtering becomes excessive.

Reports of sustained self-sputtering of copper seem to indicate that a current density of about 200 mA/cm² is required. For 50 mm targets, the DC power applied to the target for successful SSS with a stationary magnet in fairly conventional PVD reactors has been 6 kW; for 100 mm targets, 16 kW; for 200 mm targets, 20 kW. The scaling trend indicates that for 200 mm and 300 mm wafers, which require significantly larger targets for uniformity, the DC bias powers will be 35 kW to 50 kW, assuming a conventionally sized magnetron of the prior art. These power levels are considered to be impractical in commercial equipment. A 12 kW power supply is considered to be economically advantageous, and a 20 kW one to be marginally acceptable.

For these reasons, it is desirable to achieve sustained self-sputtering at a reduced power level even for large targets. It is further desirable to provide additional directional control of sputtered ions.

SUMMARY OF THE INVENTION

A sustained self-sputtering plasma reactor, particularly applicable to sputtering copper, in which the density of the plasma adjacent to the magnetron is increased by decreasing the area of the magnet assembly, preferably a circularly arranged magnet, and by positioning an anode grid between the target and the substrate being sputter deposited. The small magnet size, particularly with a magnet assembly having a compact shape with a small aspect ratio, enables self-sustained sputtering with modest target power. The uniformity of sustained self-sputtering with a small magnet is enhanced by rotating and otherwise moving the magnetron about the back of the target. The pedestal supporting the substrate may be biased relative to the grid, e.g., DC or RF biasing to increase the directionality of the sputtered particles incident on the substrate.

Uniformity of sputtering is increased by scanning the magnet in one or two dimensions about the back of the target.

DETAILED DESCRIPTION OF THE PREFERRED EMBODIMENTS

We believe that many of the problems associated with applying sustained self-sputtering to the commercial market can be reduced if not solved by reducing the volume of the high-density plasma associated with the magnetron. These method will as well provide additional controls which are useful for improving uniformity, providing a more anisotropic sputtered particle flux, and reducing device damage.

Figure 2:
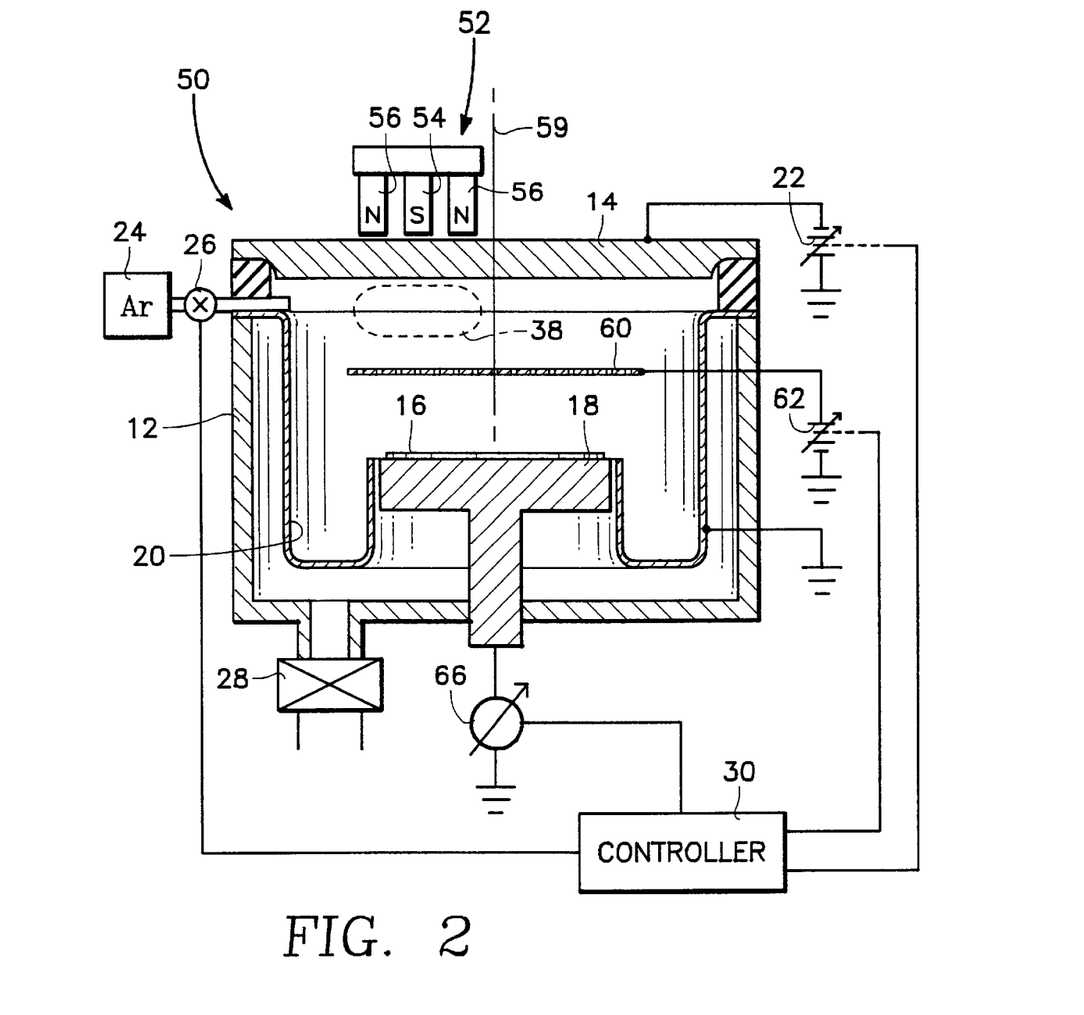
FIG. 2 is a schematic cross-sectional view of one embodiment of a PVD reactor according to the invention.

Three interrelated features of a novel SSS PVD reactor 50 are schematically illustrated in cross-section in FIG. 2. These features present non-major changes over the conventional argon-based PVD reactor 10 of FIG. 1, thus simplifying its development and field maintenance.

A new reduced-size magnetron 52 may comprise a button magnet 54 of one polarity and a annular magnet 54 of the other polarity facing the back of the target 14. A magnetic yoke 58 on the back of the magnets 54, 56 confines the magnetic field. The magnetron 52 may be positioned away from a central axis 59 of the chamber and be circularly scanned about that axis 59 to improve the uniformity. The small size of the magnetron 52 reduces the threshold power levels for sustained self-sputtering.

A grid electrode 60 is positioned between the target 14 and the pedestal 18. It may be grounded to thereby serve as the anode or may be electrically biased, preferably positively, by a second variable DC power supply 62 or yet alternatively may be RF biased to increase the plasma density. However, we believe that grounding the grid 60 is sufficient for many applications. The grid 60 is preferably positioned about 2 to 6 cm from the target 14. This position is not close enough to interfere with the electron trajectories in the high-density plasma 38, but is close enough to still effectively act as an anode, that is, close enough that the geometry is planar to prevent plasma spreading. The grid electrode provides a more planar geometry to thus increase the density of the magnetron plasma and also provides additional controls over the ion transport.

The pedestal 18 may be electrically biased, particularly with respect to the grid 60, by a selectable power supply 66, which may be a DC power supply, an RF power supply, or a combination. This pedestal biasing can be performed relatively independently of the electrical biasing conditions required for generating the plasma and increasing the plasma ion density. Hence, the pedestal bias can be more freely optimized for highly directional hole filling and other processing characteristics.

In the conventional reactor 10 of FIG. 1, the high-density plasma region 38 is coupled between the cathode target 14 and the anode shield 20. As a result, there is a significant horizontal component of the electric field, and a significant fraction of the plasma ion current is grounded to the shield, thereby reducing the effective ion current and tending to spread out the high-density plasma region 38. That is, the plasma density is not all that high.

In the inventive reactor 50 of the invention of FIG. 2, the grid electrode 60 acts as an anode grid in planar opposition to the major portion of the cathode target 14. The planar geometry reduces the tendency of the high-density plasma 38 to spread and disperse to a lower density. The fraction of sputter ions lost to the shield 20 is significantly reduced over the conventional reactor.

Figure 3:
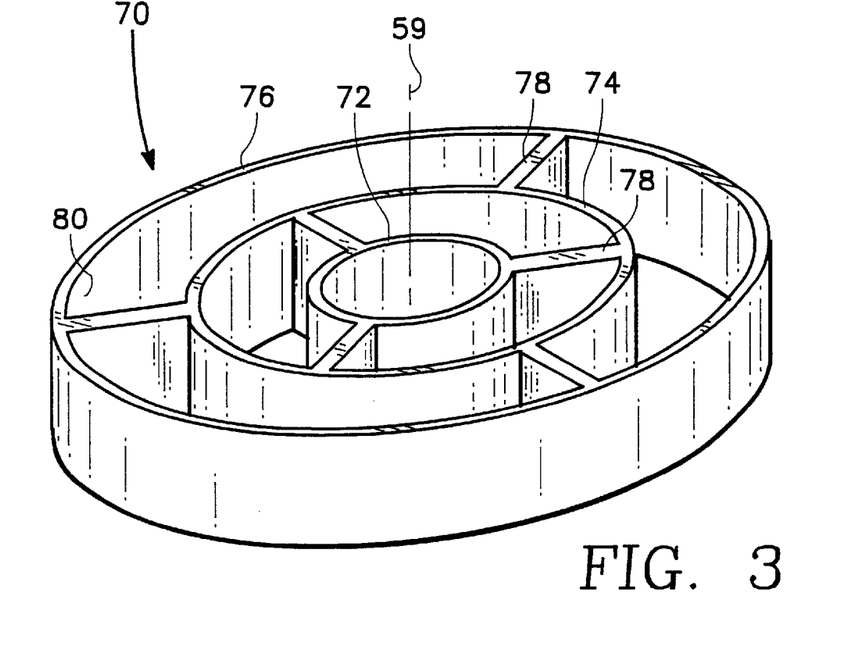
FIG. 3 is an isometric view of a chimney grid usable with the invention.

The grid 60 may be a screen-like grid of minimal thickness and high transparency. Alternatively, it may be a metal honeycomb or a metal collimator plate of substantial thickness drilled with many narrow through holes. Yet further alternatively, it may be a chimney-like structure 70, illustrated isometrically in FIG. 3, comprising three coaxial metal tubes 72, 74, 76 mechanically and electrically linked by offset sets of metal ribs 78. The tubes 72, 74, 76 and ribs 78 have minimal cross section along the axis 59 of the reactor 50 to thereby provide relatively large axial apertures 80. Tepman discloses a somewhat similar collimating chimney for a different use in U.S. Pat. No. 5,527,438. In use with the present invention, the chimney 70 is placed inside the shield 20 and is either grounded to it or separately electrically biased by the second DC power supply 62.

The plasma characteristics are nearly completely defined by the target 14 and grid anode 60. As a result, the pedestal power supply 66 can more freely apply a biasing condition to the wafer 16 based on processing considerations with lesser regards for the need to support the plasma. For example, the pedestal 18 can be biased negatively with respect to ground to accelerate the positively charged sputter ions passing through the grid 60 and thus increase their directionality for filling deep apertures. On the other hand, a lesser negative bias will reduce the energy of incident ions to reduce substrate damage.

The plasma between the grid 60 and the pedestal 18 in sustained self-sputtering is not believed to be the typical equilibrium plasma. Electron energies have been measured to be about 5 eV, far above the values in normal sputtering and indicating low collision rates for the plasma electrons. Nonetheless, a rarefied plasma is believed to exist below the grid 60 and to extend close to the pedestal 18, and a plasma sheath is believed to exist next to the pedestal 18, perhaps because of electrostatic effects. As a result, the pedestal 18 may be RF biased to create a DC self-bias relative to the plasma ions.

The magnetron 52 of the invention is substantially smaller than in the conventional reactor. As an example, as shown in the enlarged perspective, partially sectioned view of FIG. 4, the circular button magnet 54 with its north pole, for example, pointing downwardly is surrounded by the ring magnet 56 with is south pole pointing downwardly. The disk-shaped magnetic yoke 58 intensifies the magnetic field 82 adjacent to the target 14. The circular configuration of the magnet assembly provides a more efficient high-density plasma since the resultant high-density plasma region 38 is substantially circular, having only one free lateral side from which the electrons can escape. The magnetic cusp beneath the button magnet 54 is small enough in area that the electrons can diffuse across it.

Figure 4:
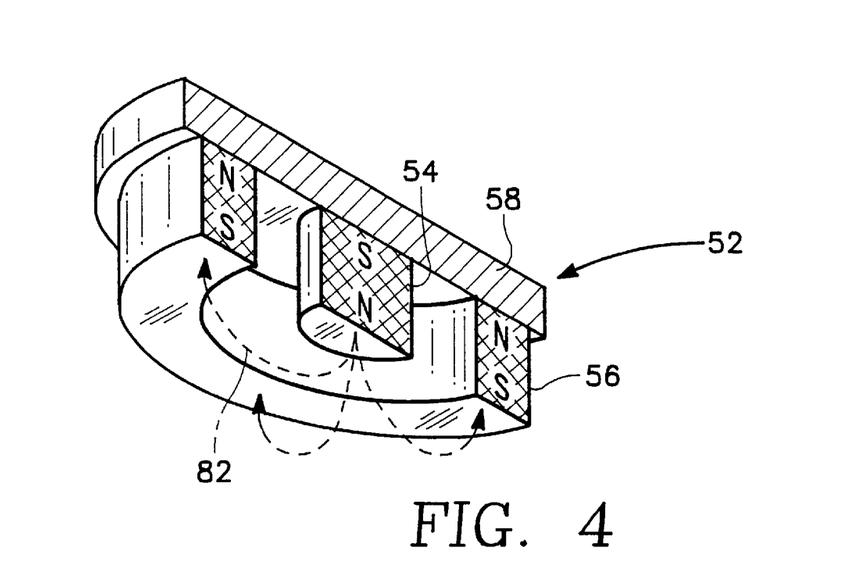
FIG. 4 is an enlarged view, partly in cross section and partly in perspective, of the magnet assembly of an embodiment of the magnetron of the invention.

As illustrated in FIG. 2 with reference to FIG. 4, the area of the magnet assembly is substantially less than half or even a quarter of the area of the target being sputtered, thereby reducing the total target power required for a high target power density in the high-density plasma region 38.

Figure 5:
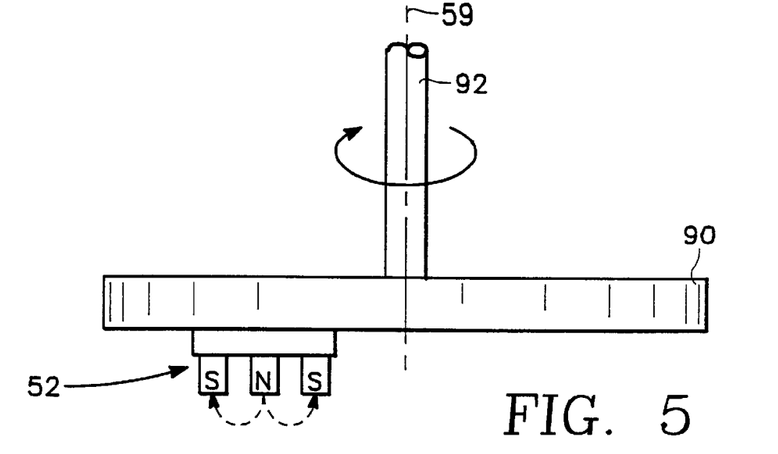
FIG. 5 is a view, partially in section and partially in plan, of the rotatable support of the magnetron of FIG. 4.

If the magnet array of the magnetron 52 is arranged in a circle as illustrated, then the diameter of the magnet assembly is less than half of the diameter of the area of the target being sputtered. That is, its area is less than 25% of that of the target. We have experimentally determined that a magnet assembly needs to have a maximum diameter of no more than 125 mm (maximum area of 123 cm$^2$) to enable a 9 kW power supply to sustain self-sputtering. For a 20 kW power supply, the estimated maximum area is 272 cm$^2$ (maximum diameter of 185 mm). The magnetron 52 is placed completely away from the central axis 59. In order to provide uniformity, the magnetron needs to be circumferentially scanned about the central axis 56, as is done by Parker and Tepman as well although their magnet assemblies essentially encompass the central axis 59. This scanning can be accomplished, as illustrated in FIG. 5 by rigidly mounting the magnetron 52 on a disk 90 which rotates on a shaft 92 extending along the central axis 59.

Figure 6:
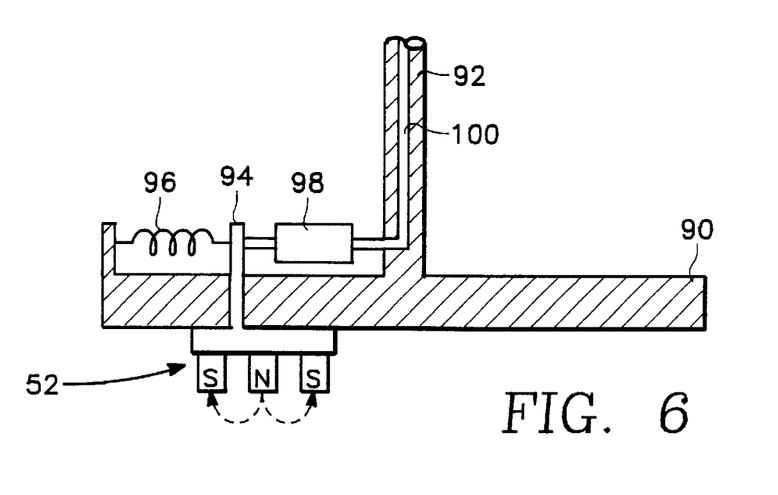
FIG. 6 is a cross-sectional view of a modification of the rotatable support of FIG. 5 which allows radial movement of the magnetron.

It may be desired to further increase the sputtering uniformity by, as illustrated schematically in FIG. 6, including a dynamic radial positioning mechanism on the rotating disk that can be actuated from a stationary point. The uniformity has the advantage of increasing target utilization with full face erosion and reducing particles arising from redeposition on unsputtered areas. An example of the radial positioning mechanism is to support the magnetron 52 on a rod 94 sliding in an unillustrated radial slot in the disk 90. The rod 92 is biased in one radial direction by a spring 96 and is selectively forced in the opposite radial direction by a pneumatic actuator 98 selectively supplied with fluid pressure through a pressure line 100 extending into and upwardly along the rotation shaft 92 which rotates the disk 90. A unillustrated rotational seal at the top of the shaft 90 connects to a fixed fluid line that is selectively energized to a variable pressure. Thereby, the magnetron is both rotated about the central axis 56 and is moved reciprocally in a linear direction parallel to the face of the target 14.

Figure 7:
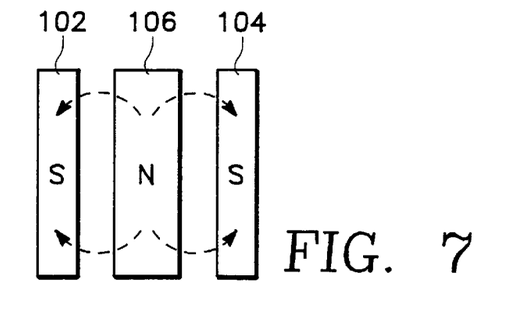
FIG. 7 is a plan view of an alternative embodiment of the magnet assembly.

The circular magnet configuration of FIG. 4 affords the advantages of a compact planar area of the high-density plasma 38 so that electron loss is minimized and the current density threshold for sustained self-sputtering is reduced. Expressed quantitatively, the circular configuration provides an aspect ratio of 1:1 where the aspect ratio is defined as the maximum lateral dimension of the magnet assembly to the minimum lateral dimension. These dimensions include only those areas in which a strong magnetic field exists between oppositely polarized magnets or areas extending laterally outside by approximately the separation of the oppositely polarized magnets. Thus, the minimum lateral dimension of the Tepman configuration is the curved length of the kidney shape. An aspect ratio of near unity minimizes the side surface area over which electrons can be lost. Another magnet configuration with an aspect ratio near unity, illustrated in the plan view of FIG. 7, includes two rectangular magnet poles 102, 104 of one polarity facing out of the illustration bracketing another rectangular magnet pole 106 of the opposed polarity. Each pole 102, 104, 106 may be composed of multiple smaller magnets of the same polarization arranged into the shape of the pole. The width of the assembly is approximately equal to its illustrated height so that the aspect ratio is approximately 1.4, that is, the ratio of the diagonal to the width. Other magnet configurations are possible, for example, an oval version of FIG. 4 or a slightly elongated or compressed version of FIG. 7. A preferred range for aspect ratios is between 1:2 and 2:1.

Experiment

The concept of sustained self-sputtering of copper was tested with several of the features mentioned above. The button and ring magnets of FIG. 4 were used with a total diameter of 11.5 cm. Thus, the magnet area was 15% of that of the 325 mm copper target. The magnets were composed of NdBFe and were estimated to produce a magnetic field of 800 gauss inside the chamber. The magnetron was placed away from the central axis and was rotated about that axis. The chimney grid of FIG. 3 was used as a grounded anode grid, although in one experiment a honeycomb collimator was instead used. A spacing between the target and substrate was maintained in a range of 10 to 16 cm.

Figure 8:
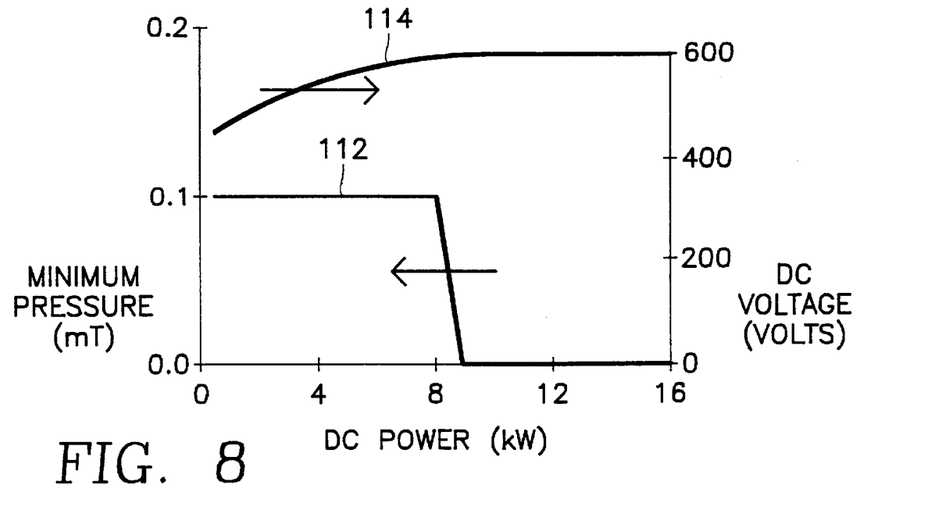
FIG. 8 is a chart showing minimum sustaining conditions for an experimental embodiment of the invention.

In a first series of experiments with this configuration, various levels of DC power were applied to the copper target. For each level, the argon flow was reduced until the plasma was extinguished. At the minimum flow level, the chamber pressure and the target voltage were measured. The results are shown in FIG. 8 in which curve 112 gives the minimum argon pressure to support a plasma and curve 114 gives the target voltage at that pressure, both as a function of the DC power applied to the target. It is seen that for lower target power, a minimum argon pressure of about 0.1 mTorr is required. However, at 9 kW and above, no argon is required to sustain the plasma. Chamber pressure with the self-sputtering plasma was measured at between $10^{-6}$ and $10^{-7}$ Torr. It is believed that these pressures could be reduced with care to bake out and the like. It is noted that these low chamber pressures during sustained self-sputtering correspond to a mean free scattering length of about 30 m and longer so there is no appreciable gas scattering in a commercially realizable chamber. This length indicates that a chamber pressure of $10^{-5}$ Torr or even $5\times10^{-5}$ Torr during sustained self-sputtering is acceptable, although a pressure of no more than $10^{-5}$ Torr is preferred. As described later, at these pressures, the argon is not discharged across the chamber. The target voltage is somewhat increased for the sustained self-sputter plasma, but is in the neighborhood of about –600 VDC.

Figure 9:
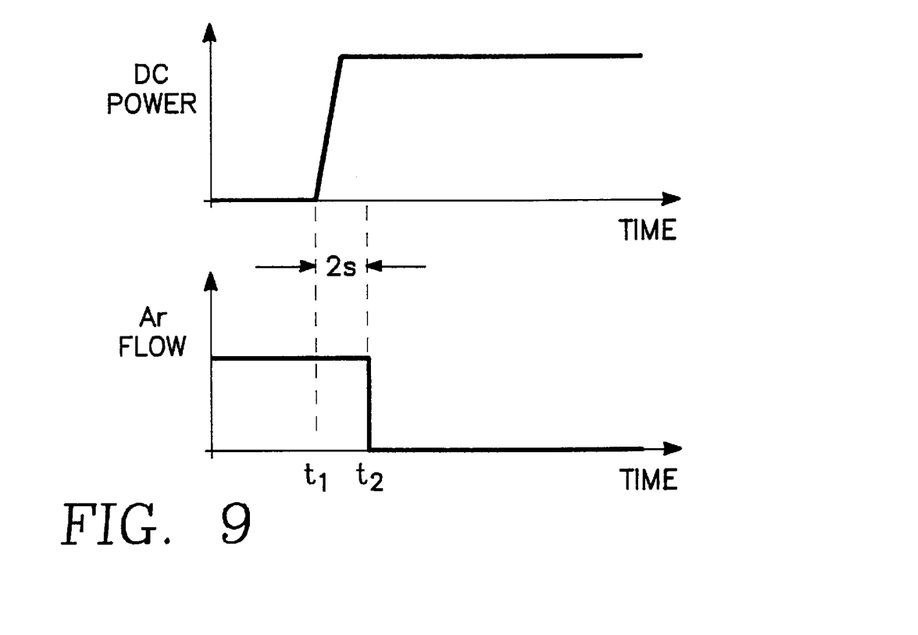
FIG. 9 is a timing diagram for igniting a sustained self-sputtering plasma.

One operational feature of sustained self-sputtering is that the plasma does not self-ignite, but a sputtering working gas needs to be initially supplied until the target begins supplying the sputtering particles. One timing diagram useful for igniting the SSS plasma is illustrated in the timing diagrams of FIG. 9. Argon is initially flowed into the chamber at rates known to sustain a plasma. After the argon flow has stabilized and the chamber has been flushed, at a time $t_1$, the DC power supply for the target is quickly changed to the intended power level, for example, between 11 and 16 kW. Then, at a time $t_2$, typically 2s after $t_1$, the flow of argon is stopped with the DC power being held constant.

In this configuration, the total ion current was measured to be about 0.48 A at a DC power level of 12 kW. The ionization fraction of copper in the SSS mode is estimated to have been about 20% to 25%. The total copper deposition rate in the SSS mode was about 200 nm/min. Later experiments have demonstrated a deposition rate of about 1 μm/min.

This configuration was tested with both trenches and vias through a silicon oxide layer. When the pedestal was DC biased at −200 VDC, the trench bottom coverage was improved. For vias, pedestal biasing at −50 VDC provided the best bottom filling.

The invention is not limited to the described embodiments. More complex configurations of the magnet assembly may be used to improve uniformity. The invention can be applied not only to copper and copper alloys, but also to other metals capable of self-sustaining a plasma. The biased grid can be advantageously applied to long-throw PVD reactors. More than one grid may be placed between the target and the pedestal, and each may be separately biased. For example, one may be grounded and another closer to the pedestal may be RF biased.

Thus, the invention provides for self-sustained sputtering of copper and other materials with only minor changes over the conventional PVD reactor. Further, the planar geometry of the grid and the ability to separately bias the wafer provides additional processing control, particularly for filling vias of high aspect ratios.

What is claimed is:

1. A sustained self-sputtering apparatus, comprising:
   a vacuum chamber including a support for a substrate;
   a sputtering target in said chamber facing said support;
   a magnet assembly positioned on a side of said target opposite a central portion of said chamber;
   a power supply electrically biasing said target with respect to a portion of said chamber and capable together with said magnet assembly of supporting a self-sustained plasma of ions sputtered from said target; and
   a grid positioned between said target and support at a position within a range of 2 to 6 cm from said target and biasable at an electrical potential.

2. The sputtering apparatus of claim 1, wherein said target comprises copper.

3. The sputtering apparatus of claim 1, wherein said magnet assembly has an area between magnet portions thereof of no more than 25% of an area of said target.

4. A sustained self-sputtering apparatus, comprising:
   a vacuum chamber including a support for a substrate;
   a sputtering target in said chamber facing said support;
   a magnet assembly positioned on a side of said target opposite a central portion of said chamber;
   a first power supply electrically biasing said target with respect to a portion of said chamber and capable of supporting a self-sustained plasma of ions sputtered from said target;
   a grid positioned between said target and support and biasable at an electrical potential; and
   a second power supply electrically biasing said support with respect to said grid.

5. The sputtering apparatus of claim 4, wherein said second power supply biases said support negatively DC with respect to said grid.

6. The sputtering apparatus of claim 4, wherein said second power-supply is an RF power supply.

7. The sputtering apparatus of claim 4, wherein said target comprises copper.

8. The sputtering apparatus of claim 4, wherein said magnet assembly has an area between magnet portions thereof of no more than 25% of an area of said target.

9. A self-sustained sputtering apparatus, comprising:
   a vacuum chamber including a support for a substrate;
   a sputtering target in said chamber facing said support;
   a magnet assembly positioned on a side of said target opposite a central portion of said chamber and having an area between magnet portions thereof of less than 25% of an area of said sputtering target, said magnet assembly being rotatable about a cental axis of said sputtering target;
   an electrically biasable grid positioned between said target and said support; and
   a power supply electrically biasing said target with respect to a portion of said chamber and capable of supporting a self-sustained plasma of ions sputtered from said target.

10. The sputtering apparatus of claim 9, wherein said sputtering target comprises copper sputtering material.

11. The sputtering apparatus of claim 9, wherein said magnet assembly is rotatable about an axis passing through said target.

12. The sputtering apparatus of claim 11, further comprising:
    a disk rotable about said central axis and having a slot within which said magnet assembly slides, and
    motive means mounted on said disk and selectively controlling a position of said magnet assembly in said slot;
    whereby said magnet assembly is additionally reciprocally and linearly movable parallel to a plane of a face of said target.

13. The sputtering apparatus of claim 9, wherein said magnet assembly has an aspect ratio of between 1:2 and 2:1.

14. The sputtering apparatus of claim 13, wherein said magnet assembly comprises a ring magnet of a first polarity surrounding a circular magnet of a polarity opposite said first polarity.

15. The sputtering apparatus of claim 14, wherein said ring magnet has a diameter of no more than 125 mm.

16. The sputtering apparatus of claim 15, wherein said support is sized to support a substrate having a diameter of at least 200 mm.

17. The sputtering apparatus of claim 9, wherein said grid is positioned in a range of 2 to 6 cm away from said target.

18. A sputtering method in a sputtering chamber comprising a target, a magnet assembly on a side of said target, a substrate support for supporting a substrate, and a grid positioned between said target and said support, said method comprising the steps of:
    holding said grid at a predetermined potential;
    igniting a plasma in said chamber adjacent to said target; and after said plasma has been ignited, holding an interior of said chamber at a pressure of less than $1 \times 10^{-6}$ Torr and applying sufficient electrical power to said target to self-sustain a target plasma in a volume of said chamber adjacent to said magnet assembly.

19. The method of claim 18, wherein said target comprises copper.

20. The method of claim 18, further comprising moving said magnet assembly about a back of said target.

21. The method of claim 20, wherein said moving step includes a sub-step of rotating said magnet assembly about an axis passing through said target and an independent sub-step of reciprocally translating said magnet assembly in a direction parallel to a face of said target.

22. The method of claim 18, wherein said magnet assembly has an aspect ratio in a range of 1:2 to 2:1.

23. The method of claim 18, wherein said sufficient power is less than 20 kW.

24. The method of claim 18, wherein said igniting step comprises:

flowing a working gas into said chamber;

applying electrical power to target to ignite said working gas into a plasma; and ceasing said flowing said working gas while continuing said applying sufficient electrical power to said target to self-sustain said target plasma.

25. The sputtering method of claim 18, further comprising moving said magnet assembly over said side of said target, wherein said magnet assembly has an area between magnet portions thereof of no more than 25% of an area of said target.

* * * * *